(12) United States Patent
Nakatani et al.

(10) Patent No.: US 10,748,860 B2
(45) Date of Patent: Aug. 18, 2020

(54) AMPLIFIER

(71) Applicant: Mitsubishi Electric Corporation, Tokyo (JP)

(72) Inventors: Keigo Nakatani, Tokyo (JP); Yuji Komatsuzaki, Tokyo (JP); Shintaro Shinjo, Tokyo (JP); Koji Yamanaka, Tokyo (JP); Shohei Imai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/099,968

(22) PCT Filed: Jul. 1, 2016

(86) PCT No.: PCT/JP2016/069620
§ 371 (c)(1),
(2) Date: Nov. 8, 2018

(87) PCT Pub. No.: WO2018/003111
PCT Pub. Date: Jan. 4, 2018

(65) Prior Publication Data
US 2019/0148315 A1    May 16, 2019

(51) Int. Cl.
*H01L 23/64* (2006.01)
*H03F 1/42* (2006.01)
*H03F 1/56* (2006.01)
*H03F 1/08* (2006.01)
*H01L 23/66* (2006.01)
(Continued)

(52) U.S. Cl.
CPC ............ *H01L 23/645* (2013.01); *H01L 23/66* (2013.01); *H01L 24/48* (2013.01); *H03F 1/08* (2013.01); *H03F 1/42* (2013.01); *H03F 1/565* (2013.01); *H03F 3/16* (2013.01); *H03F 3/195* (2013.01); *H01L 2223/6655* (2013.01); *H01L 2224/451* (2013.01); *H01L 2224/48091* (2013.01); *H01L 2224/48106* (2013.01); *H01L 2224/48195* (2013.01); *H01L 2924/19042* (2013.01); *H01L 2924/19105* (2013.01); *H01L 2924/19107* (2013.01); *H01L 2924/30107* (2013.01);
(Continued)

(58) Field of Classification Search
CPC ... H01L 23/5227; H01L 23/64; H01L 23/642; H01L 23/645; H01L 23/647
See application file for complete search history.

(56) References Cited

U.S. PATENT DOCUMENTS 6,181,200 B1 *  1/2001  Titizian ................. H01L 23/642
                                                  257/E21.008
6,734,728 B1   5/2004  Leighton et al.
(Continued)

*Primary Examiner* — Cuong Q Nguyen
(74) *Attorney, Agent, or Firm* — Birch, Stewart, Kolasch & Birch, LLP.

(57) ABSTRACT

Parallel inductors include a first metal wire (8a or 8b) for connecting a drain terminal (2) and a first metal pattern (7a or 7b), and a second metal wire (10a or 10b) for connecting the first metal pattern (7a or 7b) and a second metal pattern (9a or 9b). The second metal wires (10a and 10b) are each positioned between the corresponding first metal wire (8a or 8b) and a corresponding third metal wire (12a or 12b) for connecting the drain terminal (2) and a third metal pattern (11). The direction of current through the second metal wires (10a and 10b) is opposite to the direction of current through each of the first metal wire (8a or 8b) and the third metal wire (12a or 12b).

4 Claims, 4 Drawing Sheets

(51) Int. Cl.
*H03F 3/195* (2006.01)
*H01L 23/00* (2006.01)
*H03F 3/16* (2006.01)

(52) U.S. Cl.
CPC .............. *H01L 2924/30111* (2013.01); *H03F 2200/387* (2013.01); *H03F 2200/391* (2013.01)

(56) References Cited

U.S. PATENT DOCUMENTS

| | | |
|---|---|---|
| 7,564,303 B2 | 7/2009 | Perugupalli et al. |
| 2015/0235941 A1 | 8/2015 | Nishijima |

\* cited by examiner

AMPLIFIER

TECHNICAL FIELD

The present disclosure relates to amplifiers that include a parallel inductor including a metal wire and a capacitor in an output circuit of a transistor to reduce parasitic capacitance.

BACKGROUND ART

In recent years, to increase the bandwidth of an amplifier, forming near a transistor a parallel inductor as a resonance circuit using a metal wire connected to the drain terminal and a capacitor prevails (see Patent Literature 1, for example). The resonance circuit is a circuit for reducing the influence of parasitic capacitance of the transistor (drain-source parasitic capacitance Cds), and is formed using the metal wire (inductor) and a pattern of a circuit board (capacitor).

CITATION LIST

Patent Literature

Patent Literature 1: U.S. Pat. No. 7,564,303

SUMMARY OF INVENTION

Technical Problem

However, the above conventional configuration is the circuit that achieves matching by using a capacitor having large capacitance and an inductor made of metal wire, thereby failing to implement an ideal parallel inductor due to the high capacitive capacitor and more likely causing unnecessary resonance. Moreover, a signal (current) flows in the same direction through metal wires arranged in parallel to cause mutual inductance between the metal wires, so that the inductance of the circuit as seen from the transistor is increased and that a desired circuit impedance cannot be achieved. Thus, the conventional configuration narrows the band for a desired bandpass characteristic and has difficulty in performing wideband signal amplification.

One or more embodiments in the present disclosure have been made to solve such problems, and an object of the present embodiments is to provide an amplifier capable of performing wideband signal amplification.

Solution to Problem

An amplifier according to the present disclosure includes: a set of parallel inductors comprising: a first metal wire for connecting a drain terminal of at least one transistor and a first metal pattern provided on a first substrate with a predetermined dielectric constant; and a second metal wire for connecting the first metal pattern and a second metal pattern provided on a second substrate with a dielectric constant larger than the dielectric constant of the first substrate; and an output circuit comprising: a third metal wire for connecting the drain terminal of the transistor and a third metal pattern provided on the first substrate; and a fourth metal wire for connecting the third metal pattern and an output terminal, wherein the second metal wire is positioned between the first metal wire and the third metal wire, and a direction of current through the second metal wire is opposite to a direction of current through each of the first metal wire and the third metal wire.

Advantageous Effects of Invention

The amplifier according to the present disclosure includes parallel inductors including a first metal wire for connecting a drain terminal and a first metal pattern, and a second metal wire positioned between the first metal wire and the third metal wire for connecting the drain terminal and a third metal pattern, wherein a direction of current through the second metal wire is opposite to a direction of current through each of the first metal wire and the third metal wire.

DESCRIPTION OF EMBODIMENTS

Hereinafter, to describe the present disclosure in more detail, embodiments according to the present disclosure will be described with reference to the accompanying drawings.

Embodiment 1

Figure 1:
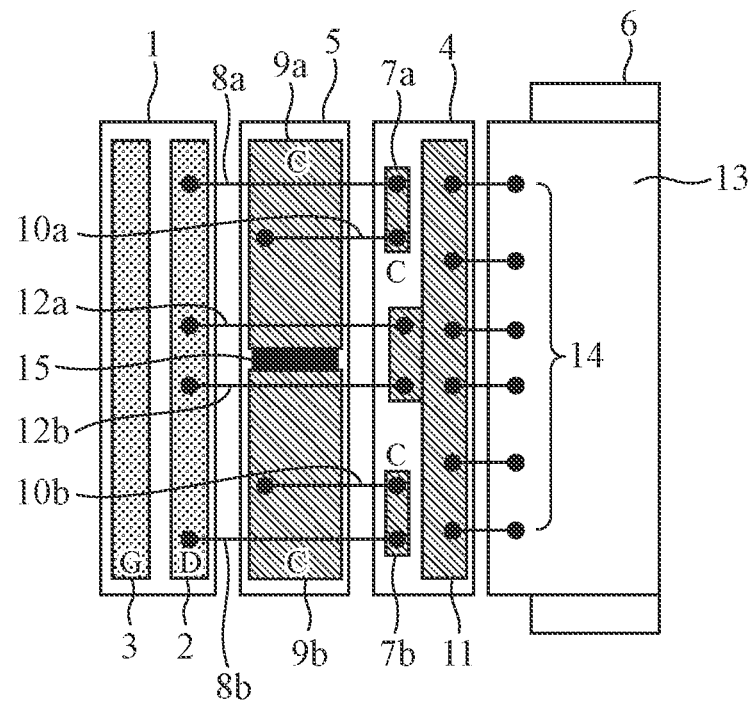
FIG. 1 is a diagram illustrating the configuration of an amplifier according to Embodiment 1 in the present disclosure.
Figure 2:
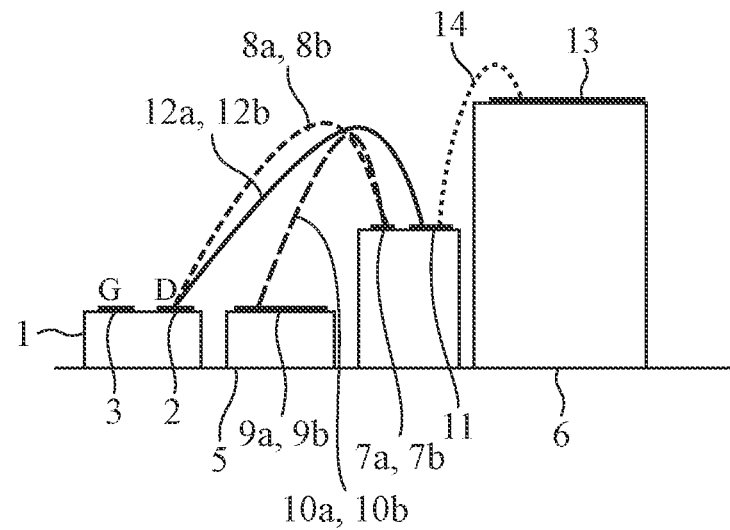
FIG. 2 is a cross-sectional view of the amplifier according to Embodiment 1 in the present disclosure as seen from the horizontal direction.

FIG. 1 is a diagram illustrating the configuration of an amplifier according to the present embodiment. FIG. 2 is a cross-sectional view of the amplifier of the present embodiment as seen from the horizontal direction.

In these figures, the amplifier includes a transistor chip 1, a drain terminal 2, a gate terminal 3, a first substrate 4, a second substrate 5, an output terminal substrate 6, first metal patterns 7a and 7b, first metal wires 8a and 8b, second metal patterns 9a and 9b, second metal wires 10a and 10b, a third metal pattern 11, third metal wires 12a and 12b, an output terminal 13, a fourth metal wire 14, and an isolation resistor 15.

The transistor chip 1 is a transistor chip, such as a field effect transistor (FET). The drain terminal 2 and the gate terminal 3 are terminals provided on the surface of the transistor chip 1. The first substrate 4 is a substrate with a predetermined dielectric constant, and the first metal patterns 7a and 7b and the third metal pattern 11 are provided on the surface of the first substrate 4. The second substrate 5 is a substrate with a dielectric constant larger than that of the first substrate 4, and the second metal patterns 9a and 9b are provided on the surface of the second substrate 5. The output terminal substrate 6 is a substrate for forming an output terminal of the amplifier, and the output terminal 13 is provided on the surface of the output terminal substrate 6. The first metal wire 8a, 8b is a metal wire for connecting the drain terminal 2 and the respective first metal pattern 7a, 7b. The second metal wire 10a, 10b is a metal wire for respectively connecting the first metal pattern 7a, 7b and the second metal pattern 9a, 9b. The third metal wires 12a and 12b are metal wires for connecting the drain terminal 2 and the third metal pattern 11. The fourth metal wires 14 are a metal wire for connecting the third metal pattern 11 and the output terminal 13. The isolation resistor 15 is a resistor connected between the second metal patterns 9a and 9b. Note that the isolation resistor 15 is not an essential component for the amplifier.

Figure 3:
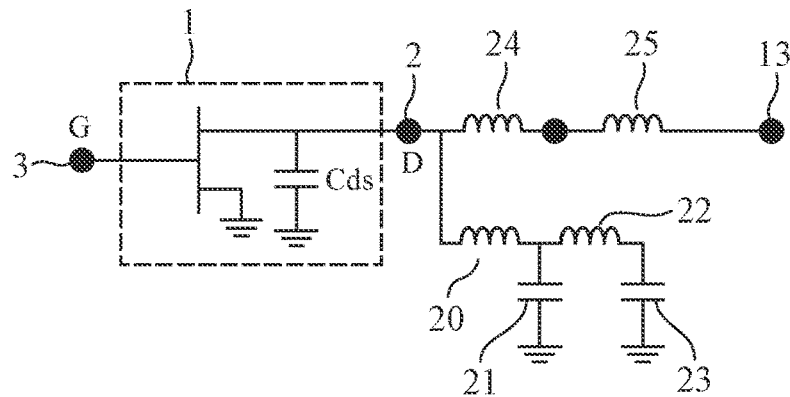
FIG. 3 is an equivalent circuit diagram of the amplifier according to Embodiment 1 in the present disclosure.

FIG. 3 is an equivalent circuit diagram of the amplifier according to Embodiment 1. The equivalent circuit includes the transistor chip 1, the drain terminal 2, the gate terminal 3, the output terminal 13, inductors 20, 22, 24, and 25, and capacitors 21 and 23 of the amplifier. Here, in order to simplify the circuit, the first metal wires 8a and 8b in FIG. 1 are integrated into the inductor 20. The second metal wires 10a and 10b are integrated into the inductor 22. The third metal wires 12a and 12b are integrated into the inductor 24, and the fourth metal wires are integrated into the inductor 25. Moreover, the capacitor 21 corresponds to the capacitance between the first metal patterns 7a, 7b and the ground through the first substrate 4, and the capacitor 23 corresponds to the capacitance between the second metal patterns 9a, 9b and the ground through the second substrate 5.

Figure 4:
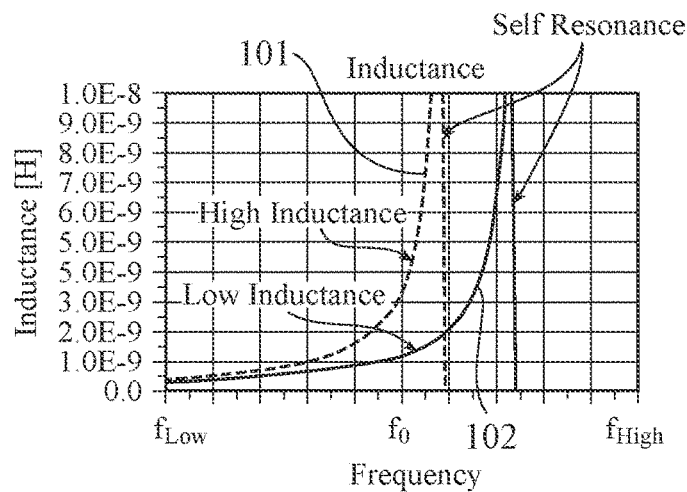
FIG. 4 is an explanatory graph illustrating frequency dependence of circuit inductance characteristic for each of the amplifier according to Embodiment 1 in the present disclosure and a conventional structure as seen from a drain terminal.

FIG. 4 is an explanatory graph illustrating frequency dependence of circuit inductance characteristic of the amplifier according to Embodiment 1 as seen from the drain terminal 2, in comparison with a conventional structure. The horizontal axis in the graph shows frequency, and the vertical axis shows inductance. Moreover, a characteristic 101 corresponds to the conventional structure, and a characteristic 102 corresponds to the structure of Embodiment 1. The circuit inductance as seen from the drain terminal 2 tends to increase as the frequency increases, and a self resonant point of the circuit exists at a certain frequency to cause the inductance to increase sharply and have a value of infinity. The inductance need not have the value indicated in FIG. 4 as long as having a tendency similar to that in FIG. 4. A plurality of self resonant points may exist as well.

Figure 5:
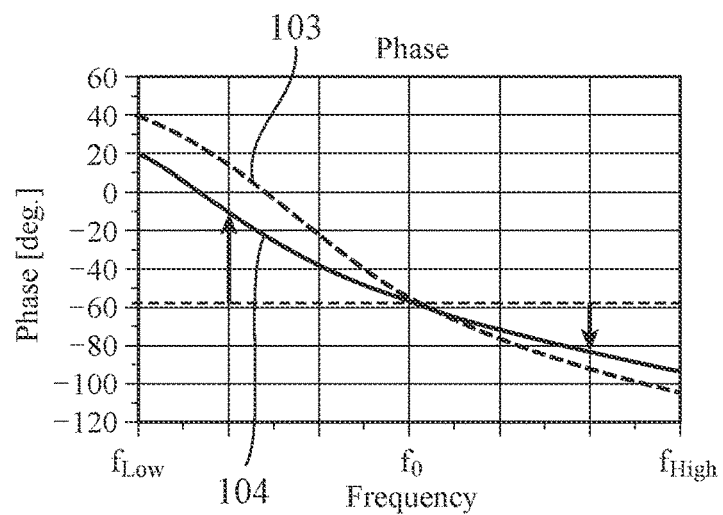
FIG. 5 is an explanatory graph illustrating frequency dependence of pass phase characteristic between the drain terminal and the output terminal for each of the amplifier according to Embodiment 1 of the present disclosure and the conventional structure.

FIG. 5 is an explanatory graph illustrating frequency dependence of pass phase characteristic between the drain terminal 2 and the output terminal 13 of the amplifier according to Embodiment 1 in comparison with a conventional structure. The horizontal axis of the graph shows frequency, and the vertical axis shows phase. Moreover, a characteristic 103 corresponds to the conventional structure, and a characteristic 104 corresponds to the structure of Embodiment 1. The pass phase characteristic from the drain terminal 2 to the output terminal 13 has a relatively flat frequency characteristic with respect to a certain frequency range. Such pass phase characteristic may apply only to a desired operating frequency.

Next, the principle of operation of the amplifier according to Embodiment 1 will be described.

Signals output from the drain terminal 2 are roughly separated into a signal passing through the third metal wires 12a, 12b and a signal passing through the first metal wires 8a, 8b.

The signal passing through the third metal wire 12a or 12b takes an output signal path connected to the output terminal 13 at the end via the third metal pattern 11 and the fourth metal wire 14. Note that the third metal wires 12a and 12b, the third metal pattern 11, and the fourth metal wire 14 make up an output circuit.

The signal passing through the first metal wire 8a or 8b is drawn to the second metal pattern 9a or 9b on the second substrate 5 at the end via the first metal pattern 7a or 7b on the first substrate 4 and the second metal wire 10a or 10b. Each signal path forms inductors parallel with respect to the output signal path. The parallel inductors reduce the influence of parasitic capacitance of the transistor, thus enabling wideband operation.

Next, characteristics of the amplifier according to Embodiment 1 will be described.

As illustrated in FIG. 4, the configuration of the present embodiment reduces an unnecessary increase in the inductance of the circuit for a certain frequency range. In FIG. 4, with the center frequency ($f_0$) being the center of the frequency axis (and $f_{Low}$ indicating a low frequency region and $f_{High}$ indicating a high frequency region), the self resonant frequency (indicated as "Self Resonance" in the figure) is low in the conventional structure, so that the inductance increases sharply near the center frequency. That is, the wideband operation is difficult to perform as the impedance of the circuit changes suddenly in a desired band of frequencies. In the present embodiment, the self resonant frequency is high and therefore the inductance is low over a wide band at and near $f_0$. That is, the wideband amplification operation can be performed since there are no sudden changes in the impedance of the circuit.

As illustrated in FIG. 5, the configuration according to the present embodiment has the pass phase characteristic in which a phase shift is smaller than that of the conventional structure with respect to $f_0$ over a certain frequency range. That is, the wideband amplification operation can be performed since the frequency dependence of the output circuit is small.

Next, the principle about why the characteristics illustrated in FIGS. 4 and 5 are obtained will be described.

As illustrated in FIG. 1, the first metal patterns 7a and 7b on the first substrate 4 are each independent and small in area in the present embodiment. Thus, the capacitance between the ground and the back of the first substrate 4 is small and therefore the patterns exhibit a substantially unappreciable (uninfluential) capacitance in a circuit including the parallel inductors. For a circuit configuration requiring a parallel inductor, a capacitance is an unnecessary factor and narrows the operating frequency band. The configuration of the present embodiment is equivalent to the circuit in which the capacitor 21 is not connected in FIG. 3, thereby being able to implement an ideal parallel inductor including the inductors 20 and 22 and the capacitor 23 and perform the wideband amplification operation.

In the second metal wire 10a or 10b flows a signal (current) in the opposite direction with respect to the third metal wire 12a or 12b, which is the output signal path, and the first metal wire 8a or 8b. Such metal wire laid to fold back in the opposite direction can reduce mutual inductance (unnecessary interference) generated between the third metal wire 12a or 12b, which is the output signal path, and the first metal wire 8a or 8b, and enable the wideband amplification operation. The conventional structure is not adapted to reduce mutual inductance and thus causes an increase in the circuit inductance. That is, when wires (lines) allowing passage of signals in the same direction are placed close to each other as in the conventional structure, the unnecessary interference occurs between the wires and theoretically causes an increase in the inductance as a function of frequency. Accordingly, in the present embodiment, the wires are connected in the opposite direction on purpose to prevent interference and smooth the operation with respect to the frequency.

Moreover, the plurality of substrates as illustrated in FIGS. 1 and 2 are used in Embodiment 1. Thus, the substrate with reduced thickness and a large dielectric constant is used when the second metal patterns 9a and 9b are to be more capacitive. This can increase the capacitance generated between the patterns and the ground. Likewise, the substrate with increased thickness and a small dielectric constant is used when the first metal patterns 7a and 7b are to be less capacitive. Substrates with the same thickness but with different dielectric constants may also be used. Likewise, substrates with the same dielectric constant but with different substrate thicknesses may also be used. Any circuit impedance can be implemented by combination of the substrate thickness and the dielectric constant to enable the wideband amplification operation.

As described above, the amplifier according to Embodiment 1 includes: a set of parallel inductors comprising: a first metal wire for connecting a drain terminal of at least one transistor and a first metal pattern provided on a first substrate with a predetermined dielectric constant; and a second metal wire for connecting the first metal pattern and a second metal pattern provided on a second substrate with a dielectric constant larger than the dielectric constant of the first substrate; and an output circuit comprising: a third metal wire for connecting the drain terminal of the transistor and a third metal pattern provided on the first substrate; and a fourth metal wire for connecting the third metal pattern and an output terminal, wherein the second metal wire is positioned between the first metal wire and the third metal wire, and a direction of current through the second metal wire is opposite to a direction of current through each of the first metal wire and the third metal wire. Thus, the wideband signal amplification can be performed.

Embodiment 2

Figure 6:
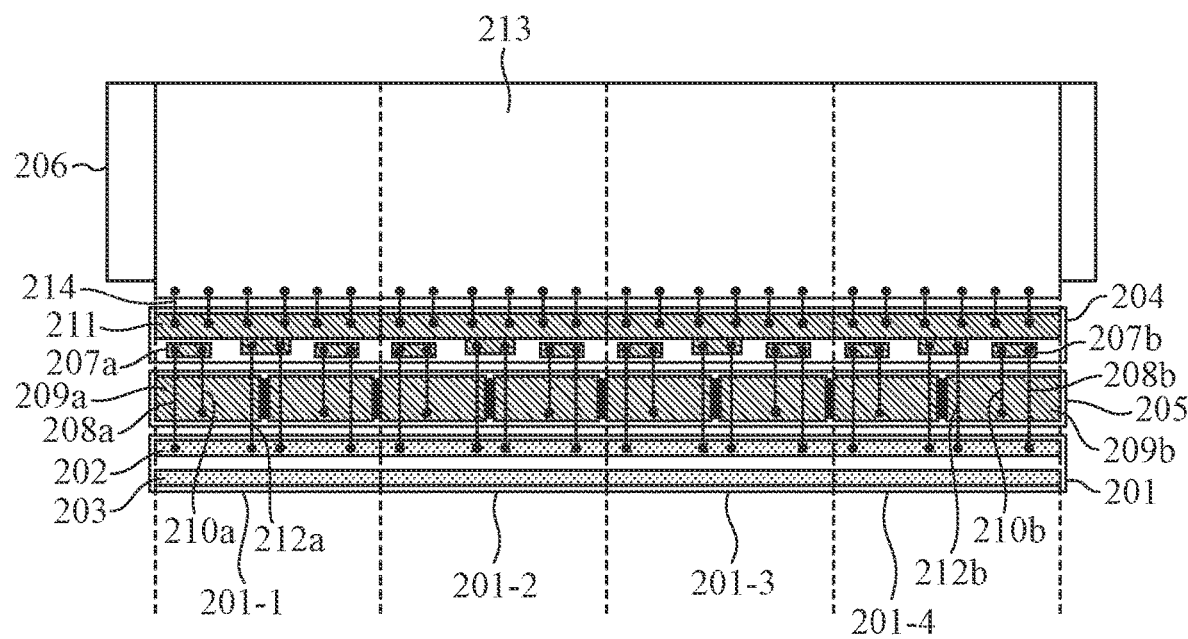
FIG. 6 is a diagram illustrating the configuration of an amplifier according to Embodiment 2 in the present disclosure.

FIG. 6 is a diagram illustrating the configuration of an amplifier according to Embodiment 2.

The amplifier according to Embodiment 2 is fabricated by providing the configuration of Embodiment 1 consecutively. FIG. 6 shows a configuration which includes four consecutive configurations of Embodiment 1. As illustrated in the drawing, on a multi-transistor chip 201, a drain terminal 202 and a gate terminal 203 are provided in common for four transistor chips 201-1 to 201-4. Moreover, the four transistor chips 201-1 to 201-4 share each of a first substrate 204 and a second substrate 205, and also share a third metal pattern 211 on the first substrate 204. The transistor chips 201-1 to 201-4 also share each of an output terminal substrate 206 and an output terminal 213. On the other hand, first metal patterns 207a and 207b, first metal wires 208a and 208b, second metal patterns 209a and 209b, second metal wires 210a and 210b, and third metal wires 212a and 212b are provided for each of the four configurations. The configuration and operation of the four configurations are similar to those in a case where four of the configurations of Embodiment 1 are provided, and thus will not be described.

Note that although the above example illustrates the four transistor chips 201-1 to 201-4 provided as the multi-transistor chip 201 for the plurality of configurations, any plurality of transistor chips can be provided.

As described above, in the amplifier of Embodiment 2, a plurality of transistors is provided consecutively, a plurality of parallel inductors and an output circuit are provided so as to correspond to the plurality of transistors, and the first substrate and the second substrate are provided in common for the plurality of parallel inductors and the plurality of output circuits. Thus, the amplifier can be used as a plurality of transistor chips.

Embodiment 3

Figure 7:
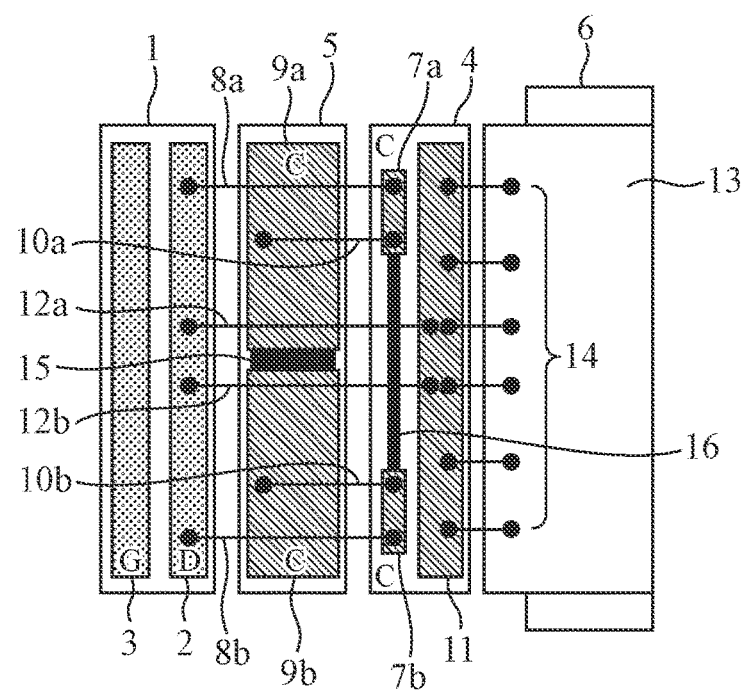
FIG. 7 is a diagram illustrating the configuration of an amplifier according to Embodiment 3 in the present disclosure.

FIG. 7 is a diagram illustrating the configuration of an amplifier according to Embodiment 3.

The amplifier of Embodiment 3 is fabricated by connecting the first metal patterns 7a and 7b in the configuration of Embodiment 1 by an isolation resistor 16. The other configurations are similar to the configurations illustrated in FIG. 1, so that the corresponding parts are denoted with the same reference numerals and will not be described. The basic operation is also similar to that of Embodiment 1.

As described above, since the first metal patterns are a pair of metal patterns including two metal patterns, and since the pair of metal patterns is connected by the isolation resistor, the amplifier according to Embodiment 3 can prevent possible oscillation. That is, in the absence of the isolation resistor, coupling of the metal wires possibly causes oscillation by an unnecessary signal generated between the circuits; however, Embodiment 3 prevents the generation of such unnecessary signal by the isolation resistor and can thus prevent oscillation.

Embodiment 4

Figure 8:
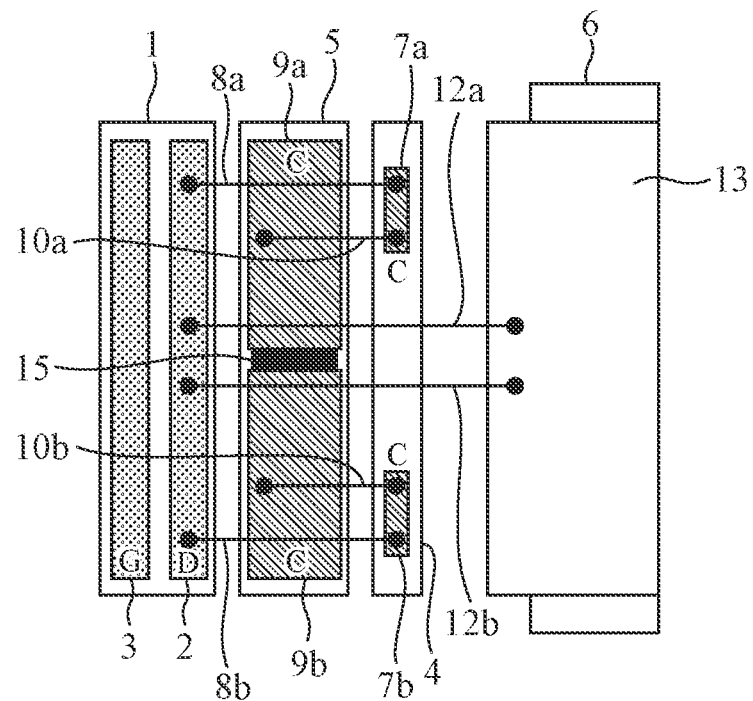
FIG. 8 is a diagram illustrating the configuration of an amplifier according to Embodiment 4 in the present disclosure.

FIG. 8 is a diagram illustrating the configuration of an amplifier according to Embodiment 4.

In the amplifier according to Embodiment 4, the third metal pattern 11 in the configuration of Embodiment 1 is removed and the third metal wires 12a and 12b are directly connected to the output terminal 13. The other configurations are similar to the configurations illustrated in FIG. 1, so that the corresponding parts are denoted by the same reference numerals and will not be described. The basic operation is also similar to that of Embodiment 1. Note that, in Embodiment 4 as well, the first metal patterns 7a and 7b may be connected by the isolation resistor 16 as in Embodiment 3.

As described above, the amplifier according to Embodiment 4 includes a set of parallel inductors comprising a first metal wire for connecting a drain terminal of at least one transistor and a first metal pattern provided on a first substrate with a predetermined dielectric constant; and a second metal wire for connecting the first metal pattern and a second metal pattern provided on a second substrate with a dielectric constant larger than the dielectric constant of the first substrate; and an output circuit comprising a third metal wire for connecting the drain terminal of the transistor and an output terminal, wherein the second metal wire is positioned between the first metal wire and the third metal wire, and a direction of current through the second metal wire is opposite to a direction of current through each of the first metal wire and the third metal wire. Such configuration can reduce the size of the substrate and the number of metal wires to thus be able to configure the amplifier at low cost and with less space.

Embodiment 5

Figure 9:
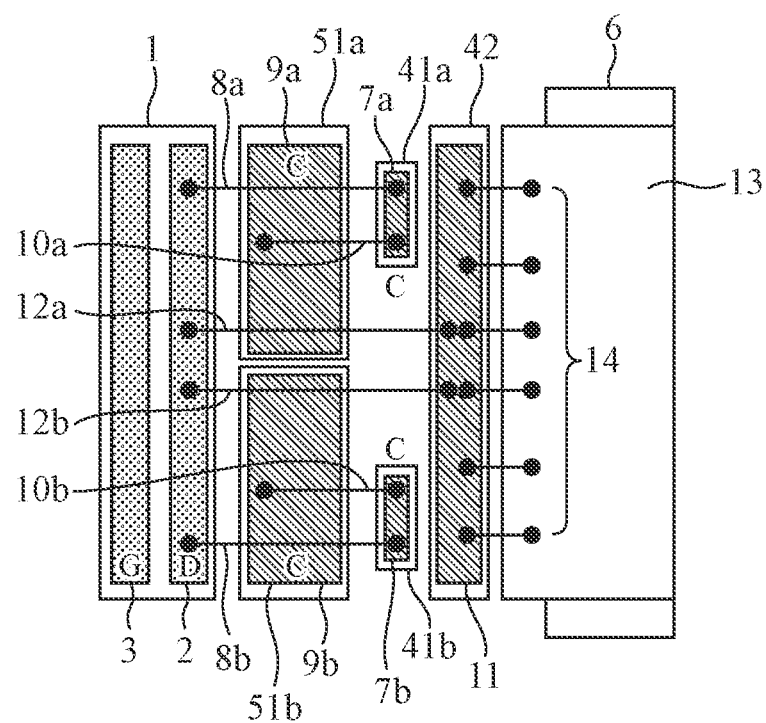
FIG. 9 is a diagram illustrating the configuration of an amplifier according to Embodiment 5 in the present disclosure.

FIG. 9 is a diagram illustrating the configuration of an amplifier according to Embodiment 5.

The amplifier according to Embodiment 5 is fabricated by replacing the first substrate 4 in the configuration of Embodiment 1 with independent substrates 41a, 41b, and 42 that are provided at sites of installation of the corresponding first metal patterns 7a and 7b and the third metal pattern 11, and replacing the second substrate 5 in Embodiment 1 with independent substrates 51a and 51b for the corresponding second metal patterns 9a and 9b. Note that the isolation resistor 15 of Embodiment 1 is removed in Embodiment 5. The other configurations are similar to the configurations illustrated in FIG. 1, so that the corresponding parts are denoted by the same reference numerals and will not be described. The basic operation is also similar to that of Embodiment 1.

As described above, the amplifier of Embodiment includes the first metal patterns and the second metal patterns that are each a pair of metal patterns including two metal patterns, and the pairs of metal patterns and the third metal pattern are placed on the substrates independent of one another, so that the substrates and the metal patterns placed on the substrates can be arranged with a higher degree of flexibility and that a desired impedance and a desired arrangement as the amplifier can easily be implemented.

Note that free combination of the embodiments, modification of any components in the embodiments, or omission of any components in the embodiments can be made within the scope of the invention.

INDUSTRIAL APPLICABILITY

As described above, one or more amplifiers according to the present disclosure relate to a configuration in which a resonance circuit is formed using the wire connected to the drain terminal and the capacitor near the transistor, and is suitable for use in the configuration for reducing the parasitic capacitance of the transistor.

REFERENCE SIGNS LIST 1, 201-1 to 201-4: transistor chip, 2, 202: drain terminal, 3, 203: gate terminal, 4, 204: first substrate, 5, 205: second substrate, 6, 206: output terminal substrate, 7a, 7b, 207a, 207b: first metal pattern, 8a, 8b, 208a, 208b: first metal wire, 9a, 9b, 209a, 209b: second metal pattern, 10a, 10b, 210a, 210b: second metal wire, 11, 211: third metal pattern, 12a, 12b, 212a, 212b: third metal wire, 13, 213: output terminal, 14, 214: fourth metal wire, 15, 16: isolation resistor, 41a, 41b, 42 51a, 51b: substrate, 201: multi-transistor chip.

The invention claimed is:

1. An amplifier comprising:
a set of parallel inductors comprising:
a first metal wire for connecting a drain terminal of at least one transistor and a first metal pattern provided on a first substrate with a predetermined dielectric constant; and
a second metal wire for connecting the first metal pattern and a second metal pattern provided on a second substrate with a dielectric constant larger than the dielectric constant of the first substrate; and
an output circuit comprising:
a third metal wire for connecting the drain terminal of the transistor and a third metal pattern provided on the first substrate; and
a fourth metal wire for connecting the third metal pattern and an output terminal, wherein
the second metal wire is positioned between the first metal wire and the third metal wire, and a direction of current through the second metal wire is opposite to a direction of current through each of the first metal wire and the third metal wire.

2. The amplifier according to claim 1, wherein the at least one transistor comprises a plurality of transistors that are provided consecutively,
the amplifier comprises a plurality of the sets of parallel inductors and the output circuits so as to correspond to the plurality of transistors, and
the first substrate and the second substrate are shared among the plurality of the sets of parallel inductors and the plurality of output circuits.

3. The amplifier according to claim 1, wherein the first metal pattern comprises a pair of two metal patterns, and the two metal patterns are connected using an isolation resistor.

4. The amplifier according to claim 1, wherein the first metal pattern and the second metal pattern are each a pair of two metal patterns, and the pairs of metal patterns and the third metal pattern are placed on substrates that are independent of one another.

* * * * *